United States Patent [19]

Saito et al.

[11] 4,339,708
[45] Jul. 13, 1982

[54] TESTING APPARATUS FOR DIELECTRIC BREAKDOWN CAUSED BY TRACKING PHENOMENA

[75] Inventors: Mitsuru Saito, Hirakata; Yuji Karatani, Amagasaki; Wataru Sakurai; Ken'ichi Nobuta, both of Hirakata, all of Japan

[73] Assignee: Matsushita Electric Industrial Co., Ltd., Osaka, Japan

[21] Appl. No.: 122,660

[22] Filed: Feb. 19, 1980

[30] Foreign Application Priority Data

Feb. 20, 1979 [JP] Japan ................................. 54-19178

[51] Int. Cl.³ ........................................... G01R 31/18
[52] U.S. Cl. .................................................... 324/54
[58] Field of Search ......................................... 324/54

[56] References Cited

U.S. PATENT DOCUMENTS

| | | | |
|---|---|---|---|
| 3,082,871 | 3/1963 | Duncan | 324/54 X |
| 3,414,808 | 12/1968 | Thomas | 324/54 |
| 3,629,699 | 12/1971 | Voss | 324/54 X |

FOREIGN PATENT DOCUMENTS 54-154368  12/1979  Japan .................................. 324/54

Primary Examiner—Gerard R. Strecker
Attorney, Agent, or Firm—Joseph W. Farley

[57] ABSTRACT

A pair of opposed electrodes is disposed on each of a plurality of electrically insulating specimens, and specified voltage is applied to each pair of electrodes. In this state, the specimens are brought to a position below a single dripping nozzle intermittently one after another to apply a drop of test solution to each specimen between the electrodes. The apparatus repeats this step cyclically.

7 Claims, 29 Drawing Figures

* C. V.: COEFFICIENT OF VARIANCE

TESTING APPARATUS FOR DIELECTRIC BREAKDOWN CAUSED BY TRACKING PHENOMENA

The present invention relates to a tracking test apparatus.

When dust and like contaminants are deposited on an insulator between electrodes to which electric power is supplied, and the moisture in the atmosphere condenses on the insulator, an electric current flows through the deposit of moist contaminants, producing joule heat to evaporate the water. At this time, a concentrated electric field is formed at the resulting break of the electric path, giving rise to scintillation which gives out heat to progressively carbonize a minute portion of the surface of the insulator. Such phenomena, when repeated, will eventually carbonize the entire surface of the insulator between the electrodes, forming a carbonized conductive path (track) between the electrodes, hence a breakdown. This phenomenon is called "tracking." An accelerated evaluation method of the surface breakdown of insulators caused by tracking is tentatively prescribed in the International Electrotechnical Commission (hereinafter referred to briefly as "IEC") Standard, IEC Pub. 112.

The test method of IEC Pub. 112, unlike the other IEC standards, has been provided tentatively as a recommended method and is subject to annual revision by Technical Committee TC 15 of IEC, because the standardization involved noticeable variations of data, while the test results are not applicable to practical purposes without any problem. However, this standard is considered to be very important as the only one basic standard for evaluating the surface degradation of insulators due to a deposit of moist contaminants since electrical fire hazards in many cases are attributable to tracking involving a leak of current. For the prevention of such fire hazards, therefore, there is an urgent need to explore tracking phenomena and evaluate the same with high precision.

Figure 1:
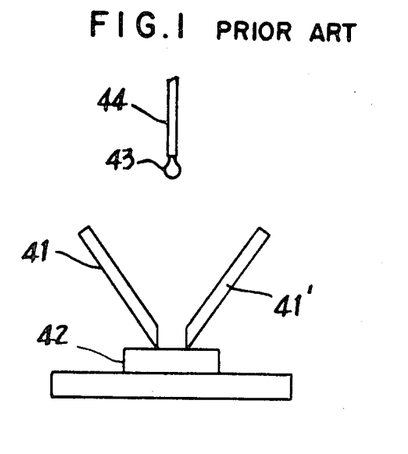
FIG. 1 is a diagram schematically showing a conventional tracking test apparatus.
Figure 2:
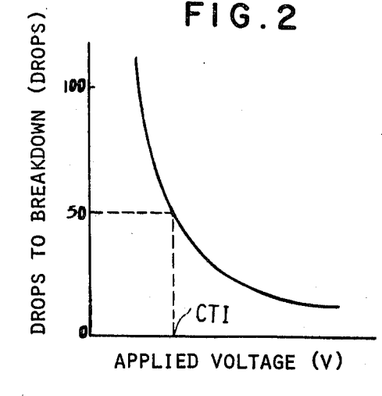
FIG. 2 is a diagram showing a CTI curve.
Figure 3:
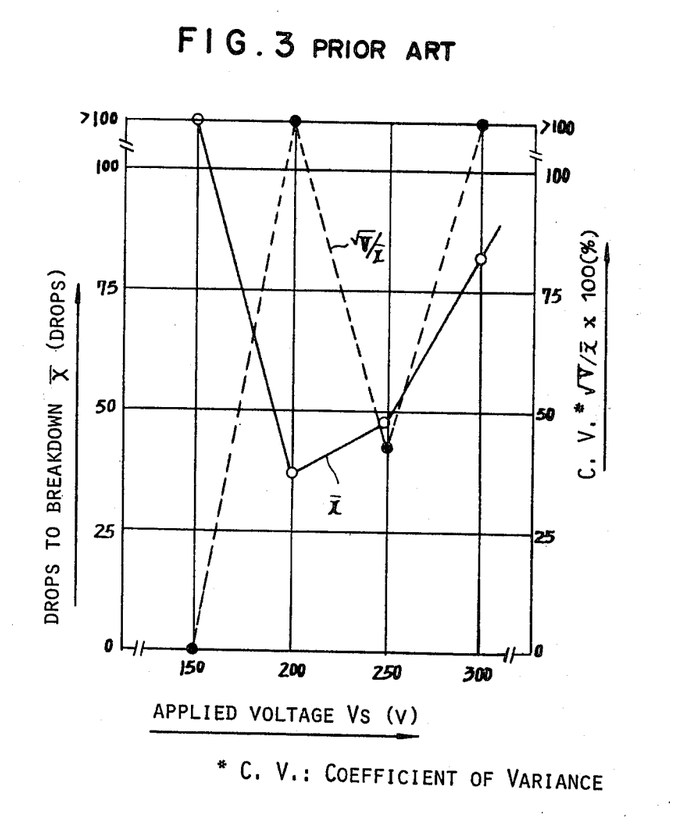
FIG. 3 is a diagram showing a CTI curve obtained with use of a known tracking test apparatus.

The tracking test described in IEC Pub. 112 is conducted in the following manner. A pair of electrodes 41 and 41' and a specimen 42 are arranged as shown in FIG. 1. With application of power across the opposed electrodes 41 and 41', a contaminant simulating test solution 43 (0.1 wt. % aqueous solution of $NH_4Cl$ having electroconductivity of $395\pm5$ ohm-cm at 25° C.) is dripped, in the form of 0.02-cc drops at a rate of one drop per $30\pm5$ seconds, from a nozzle 44 onto the specimen 42 at the midportion between the electrodes 41 and 41' to count the number of drops required to cause a breakdown on the surface of the specimen 42. The resulting count indicates the tracking resistance of the specimen under the condition of a specified power supply. Thus the tracking resistance is expressed in the number of drops causing a breakdown (drops to breakdown). The breakdown is a condition in which a current of at least 0.5 A passes across the electrodes continuously for at least 2 seconds. According to the tracking test method of IEC Pub. 112, the number of tracking breakdown drops is determined under varying power supply conditions to obtain a curve showing the relation between the applied voltage and the number of breakdown drops (hereinafter referred to as "CTI curve") as shown in FIG. 2. The voltage applied when the number of tracking breakdown drops is 50 (short-circuit current 1A, breakdown current 0.5 A) is termed the comparative tracking index (hereinafter referred to as "CTI value") of the specimen 42. The CTI curves actually determined for various insulators are rarely so smoothly curved as shown in FIG. 2. In fact, marked variations are involved in the data (numbers of tracking breakdown drops) measured by tracking test apparatus commercially available at present as shown in FIG. 3, and the CTI curves obtained by plotting mean values of measurements are generally V-shaped.

The results of tests heretofore conducted on about 1,000 kinds of materials have revealed that the causes of the variations of data can be divided into the following three types.

(I) Fluctuations of dripping condition for test solution during testing

With the conventional apparatus shown in FIG. 1, the nozzle 44 for dripping the test solution 43 is positioned immediately above the portion of the specimen 42 between the opposed electrodes 41 and 41', so that the gas and smoke evolved from the specimen 42 and an air stream due to a rise of temperature affect the test solution 43, nozzle 44 and electrodes 41, 41' while the specimen 42 is tested under a certain power supply condition, namely, from the start of dripping until a tracking breakdown occurs at a drop count, for example, of 50.

(a) The gas, smoke, air stream, etc. produced during the tracking process stain the tip of the nozzle 44 and cause adhesion of contaminants to the orifice portion of the nozzle 44 due to the surface tension of the test solution 43 to alter the amount of drops, dripping frequency and dripping position.

(b) Soot or the like will contaminate the test solution, consequently reducing the intrinsic volume resistivity of the solution 43 from the specified level.

(c) The stain of the test solution 43 at the orifice portion of the nozzle 44 and the rise of temperature of the solution will permit an accelerated reaction between the corrosive component of the solution 43 and the material of the nozzle 44, clogging the nozzle 44 and consequently altering the amount and frequency of dripping.

(d) The path of spontaneous dripping of the test solution 43 will be disturbed, permitting drops to fall onto a location other than the center of the specimen 42 between the opposed electrodes 41, 41' or possibly onto one of the electrodes to wet the same. This would interfere with proper short-circuiting between the electrodes by the test solution, hence mis-shorting. If one drop follows another in this way, the amount of the solution to be placed between the electrodes will vary. Further if the electrode is cooled, the resulting change in its temperature could lead to a variation of the data.

(e) When the opposed electrodes 41 and 41' are stained, as with soot, the solution will easily lodge thereon due to the suspension of the solution. Consequently, the rate of deposition of the solution on the electrode exceeds the rate of evaporation of the solution, producing the same effect as a reduction in the amount of solution on the specimen. This leads to mis-shorting.

Thus the dripping condition for the test solution fluctuates greatly during the test, while the causes of the fluctuations are of low reproducibility, consequently leading to variations in the data obtained from repeated tests.

(II) Fluctuations of contact condition for electrodes during testing

Evaporation of the test solution 43 and scintillation, when repeated during testing, deform the specimen 42 and alter the condition in which the electrodes 41 and 41' are in contact with the specimen.

(f) When the specimen 42 has deformed, the contact load (having a vertical component of 100 g) of the opposed electrodes 41, 41' meeting the specified standard acts on the specimen 42 at the angle of contact between the electrodes and the specimen to further promote the deformation of the specimen 42. This entails unbalanced contact between the electrodes 41, 41' and the specimen 42 and produces a gap between the electrodes and the specimen. As a result, scintillation concentrically occurs at the gap during the tracking process, causing marked damage to a portion of the specimen 42 and to the electrodes and impeding progress of normal tracking.

(g) With the conventional apparatus, the deformation of the specimen 42 reduces the specified spacing, 4 mm, between the opposed electrodes 41, 41', especially giving a smaller spacing between the electrodes at the space immediately above the specimen 42 than at the surface of the specimen. During the tracking process, arc discharge could then take place above the specimen surface. The variation of the spacing between the electrodes and the attendant arc discharge lead to great variations in the data. The arc discharge is more likely to occur with materials which evolve gas markedly or are easily meltable during testing.

(h) When setting the test conditions, it is extremely difficult to set the condition of contact between the electrodes 41 and 41' and the specimen 42 according to the standard. Furthermore the adjustment of the contact load, contact line, contact angle, spacing between the contact points, etc. with improved accuracy requires much labor or skill, with the result that the test data obtained will differ from operator to operator. Unless the conditions are set accurately before testing, the conditions will fluctuate greatly during testing.

Because of these causes and also because the standard conditions are of low reproducibility, the data obtained by repeated tests involve increased variations.

(III) Discharge and ignition during testing

Even if the causes (I) and (II) have been eliminated, the test data include variations which appear attributable to the contents and the degradation of the material, tracking and other phenomena which still remain to be fully clarified. Our research so far conducted has revealed that the following phenomena occur in the course of tracking. These phenomena are detectable by the methods to be described.

(1) Scintillation occurring upon evaporation of the test solution. This phenomenon can be detected from minute deformation, resembling a high frequency wave, of the current wave form immediately after the evaporation of the test solution.

(2) Carbonization on the surface of the material. This is detectable from an increment with time of the peak value of the form of current through the test solution on the surface of the specimen.

(3) Mechanical break of the track of the specimen. This is detectable from a reduction with time of the peak value of the same current wave form as in (2).

(4) Dielectric breakdown of the specimen. This is detectable from an abrupt increase in the current under the breakdown condition in which a current of at least 0.5 A passes continuously for at least 2 seconds.

(5) Self-heat generation of the specimen. This is detectable from a relatively slow increase of the current across the specimen surface occurring before or after a breakdown on the surface.

(6) Self-ignition of the specimen caused by mechanical break of the track. This is detectable from a single abrupt increment of the current wave form.

(7) Ignition of the specimen. This is caused by self-heat generation of the specimen, leading to red-hot heating of the track, which in turn ignites the neighboring portion of the specimen. In this case, the slow increase of the current mentioned in (5) involves a sharp rise of the current.

(8) Flash ignition of the specimen. This occurs when the flammable gas evolved from the specimen is ignited by the heat of the arc discharge to be described below. In this case, the wave form to be mentioned in (9) below involves a sharp exponential rise of the current.

(9) Arc discharge between the electrodes. The scintillation mentioned in (1) forms a track as described in (2) and also causes the specimen to release a gas, which is excited to cause arc discharge. This phenomenon produces an irregular high current wave form. This phenomenon could occur in the absence of water vapor if the specimen gives off a large amount of gas.

(10) Ohmic properties of the carbonized track. Some carbonized tracks are in accordance with Ohm's law, such that when a slowly increasing voltage is applied to the track after a power supply thereto has been interrupted following a breakdown or ignition, the current increases with the increase of the voltage, whereas other carbonized tracks will not follow Ohm's law. We call these facts "Ohmic properties". After ignition or arc discharge has occurred before a breakdown, breaking the track between the electrodes by the resulting thermal impact, the specimen usually will not follow Ohm's law.

These phenomena differ greatly with the material of the specimen, power supply, material of the electrodes and spacing between the electrodes and have some relation with variations of the data in respect of the following.

(i) The variation due to a break of the track occurs predominantly with specimens in which the track is liable to break mechanically owing to thermal impact or local thermal contraction.

(j) The variation due to ignition often occurs with specimens in which the track formed between the electrodes is so small that it is unable to pass a current of 0.5 A or greater continuously for 2 seconds when ignited by breakdown energy.

(k) The variation due to arc discharge often occurs with specimens in which the track gradually formed by scintillation differs in resistivity from the track rapidly formed by the heat of arc discharge.

These three causes for the variations of the data provide useful clues to the clarification of tracking phenomena inherent in the material of the specimen and test conditions. These causes can be determined by measuring the ohmic properties of the carbonized track after the tracking test. The causes for the variations of the data and the tracking phenomena inherent in the specimen can be evaluated directly by accurately measuring and recording the phenomena (1) to (10) which can be individually detected from the wave form of the leakage current between the electrodes in the course of the tracking test.

An overall review of the causes (I) to (III) for the variations of the data reveals that whereas the causes (I) and (II) must be eliminated by conducting the test under accurately controlled conditions, the causes (III) are such that the resulting variations of the data should be accurately determined as part of the data. Accordingly there is the necessity of providing a test apparatus which is usable free of the causes (I) and (II).

To eliminate the fluctuations of the dripping condition, the test apparatus commercially available at present are provided with means, such as (1) a dispenser (pump) for applying drops of specified volume with a specified frequency, and (2) an auxiliary nozzle by which drops of specified volume run off from a dripping nozzle are applied with a specified frequency. However, since the dripping nozzle 44 for the test solution 43 is disposed immediately above the specimen 42 as shown in FIG. 1, these means are useful for eliminating the cause (a) only but are unable to overcome the causes (b) to (g). The test apparatus equipped with the means (2) is adapted to test a plurality of specimens at the same time by controlling a plurality of dripping nozzles arranged in parallel and opposed to the specimens respectively, by a control unit for the dripping frequency adjusting means. However, with specimens which are subject to arc discharge as described in (III), the state of the gas and smoke evolved from the specimen and the stream of air due to a rise of temperature differ from specimen to specimen, so that extreme difficulties are encountered in controlling the fluctuating dripping conditions for the plurality of dripping nozzles by the single common control unit. Furthermore the arrangement is not effective on the phenomenon (III), (9). Consequently the apparatus is useful only for specimens which involve reduced evolution of smoke or gas.

Additionally much still remains to be clarified as to the tracking phenomena heretofore encountered with the presently commercially available test apparatus, and consequently variations occur for causes not fully understood. For these reasons, none of the known apparatus are entirely free of the causes (I) and (II) described above, to say nothing of the causes (III). Accordingly frequent troubles have been experienced with electric appliances having incorporated therein insulators which are said to have good tracking resistance. It has therefore been urged to revise the tracking test method per se.

The present invention contemplates provision of an apparatus which is adapted to perform a tracking test according to the method of IEC Pub. 112 with high precision and high efficiency while parallelly measuring and recording various phenomena attendant on the tracking process to explore tracking phenomena and the causes of variations of data inherent in a particular specimen and, at the same time, evaluate permissble conditions for avoiding electrical fire hazards.

Preferred embodiments of the invention will be described below with reference to the drawings, in which:

FIGS. 9a and 9b schematically show a mechanism for operatively associating specimens with the dripping nozzle, FIG. 9a being a front view and FIG. 9b being a top view;

First, a description will be given of the basic dripping operation of the apparatus of the invention. The gas and smoke evolved from the specimen as well as the air stream produced by a rise of the temperature of the specimen during testing will affect the dripping nozzle, the test solution passing through the nozzle, electrodes, etc., consequently fluctuating the condition under which the test solution is dripped. The occurrence of the gas, smoke and air stream are inherent in tracking phenomena and are not avoidable. However, the nozzle is necessary only when dripping the test solution, namely, for a moment, for example, for one second every 30 seconds, and is unnecessary for the other 29 seconds. Contamination of the electrodes will produce little or no change in the power supply condition, so that precautions should be taken only to avoid deposition of the test solution on contaminated electrodes. The contamination of the test solution and the accelerated corrosive reaction due to an air stream would become negligible if the test solution is passed through the nozzle more frequently at a shorter interval than 30 seconds.

Figure 4A:
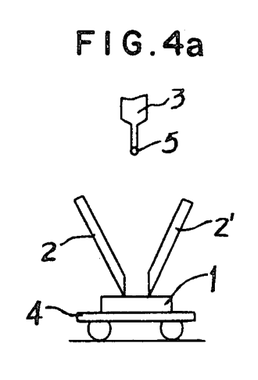
FIGS. 4a and 4g are diagrams showing the basic operation of a tracking test apparatus embodying the invention.
Figure 4B:
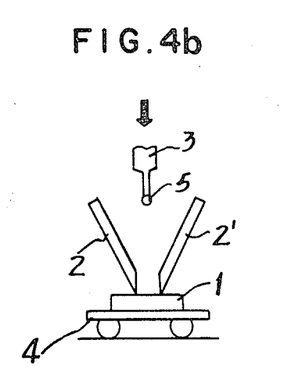
Figure 4C:
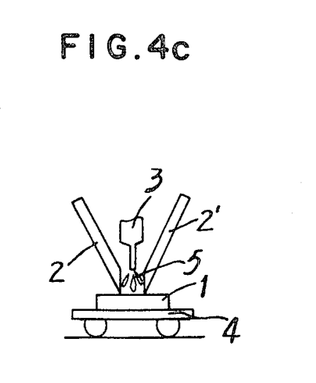
Figure 4D:
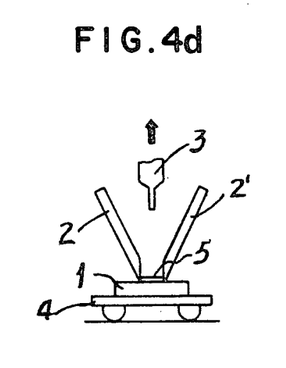
Figure 4E:
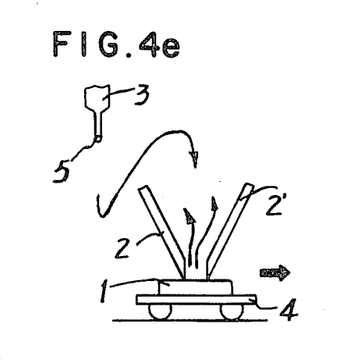
Figure 4F:
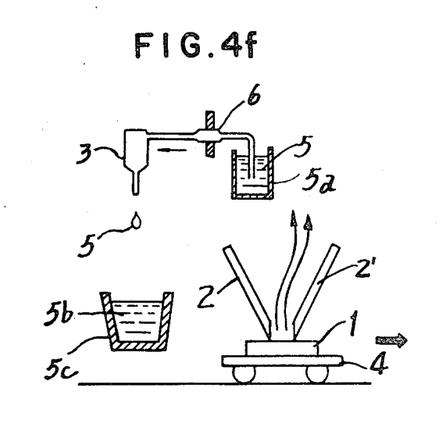
Figure 4G:
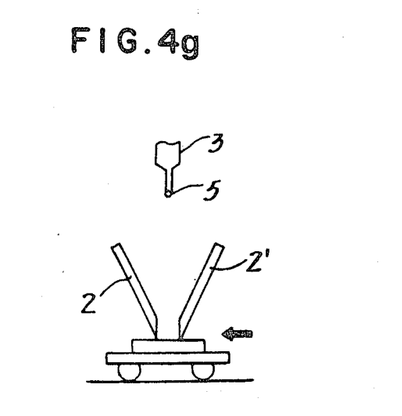

When the test solution is dripped according to the procedure illustrated in FIGS. 4a to 4g based on the above concept, the fluctuations of the dripping condition can be minimized. For the dripping operation, a specimen support 4 is moved so that the center of a specimen 1 which is located between opposed electrodes 2 and 2' is positioned immediately below a dripping nozzle 3 as shown in FIG. 4a. Simultaneously with this movement, the nozzle 3 is lowered as seen in FIG. 4b. When the nozzle 3 has been brought to the position shown in FIG. 4c with its tip positioned close to the forward ends of the electrodes 2, 2', the nozzle 3 is quickly brought to a halt, giving an inertia to the solution and causing a drop of solution to fall and uniformly spread over the specimen between the electrodes 2, 2', whereby mis-shorting can be avoided. After dripping, the nozzle 3 is raised as seen in FIG. 4d, and at the same time, the specimen support 4 is moved away from below the nozzle 3 in the direction of an arrow in FIG. 4e, with application of voltage to the electrodes 2, 2' which are held in contact with the specimen 1 under the same condition. The test solution 5 in a tank 5a is thereafter intermittently passed through the nozzle to clean the interior of the nozzle 3 with the solution. The wash liquor 5b is received in a container 5c (see FIG. 4f). At this time, a dripping control dispenser 6 is operated to provide drops of solution 5 of constant volume as specified by the test standard for effective cleaning and also not to permit the solution 5 to wet the electrodes 2, 2' or an end portion of the specimen 1 during the movement of the specimen support 4. The support 4 is returned to immediately below the nozzle 3 as seen in FIG. 4g immediately before the subsequent application of a drop to the specimen 30 seconds after the start of the dripping operation.

For the operation described above, the specimen 1 and the nozzle 3 are moved both horizontally and vertically relative to each other. This movement will be referred to as "basic dripping operation."

Figure 5A:
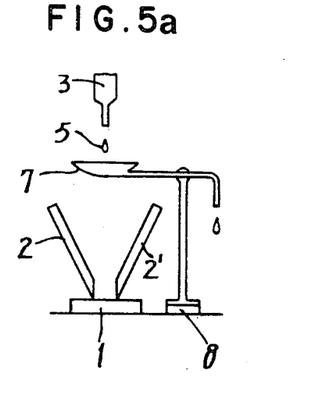
FIGS. 5a, 5b and 5c are diagrams showing blocking means incorporated in the apparatus of the invention.
Figure 5B:
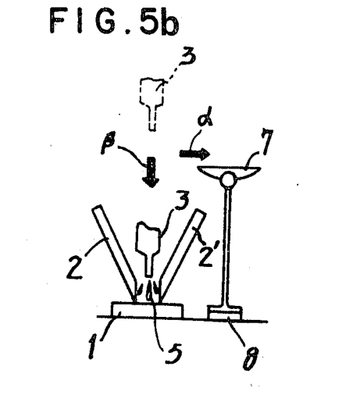
Figures 5C, 6:
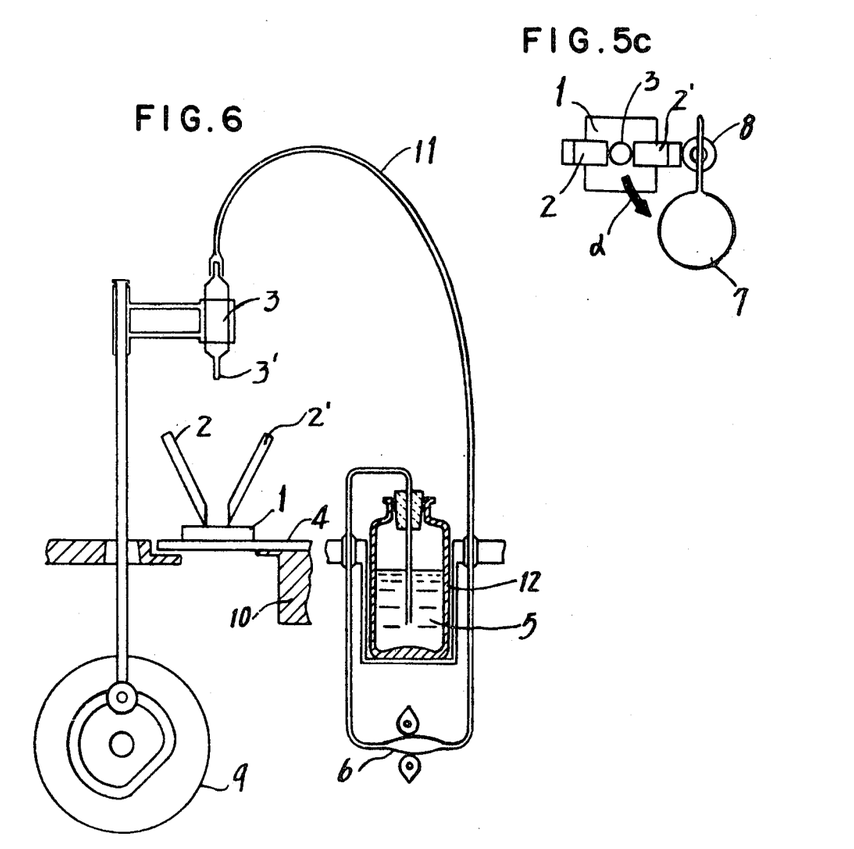
FIG. 6 is a diagram partly broken away and showing the structure of a dripping nozzle of the apparatus.

To protect the dripping nozzle 3 from the gas evolved from the specimen 1 or an air stream during testing, it is possible to provide a blocking plate 7 between the specimen 1 and the nozzle 3 as illustrated in FIGS. 5a to 5c. As shown in FIG. 5a, the blocking plate 7 is brought to a position between the specimen 1 and the nozzle 3 immediately after dripping to protect the nozzle 3 and also to serve as a receptacle for receiving an excess of the test solution 5. Immediately before dripping, the blocking plate 7 is moved by a shifter 8 away from below the nozzle 3 horizontally in the direction of an arrow α, and the nozzle 3 is subsequently moved vertically as indicated by an arrow β to allow the solution 5 to fall onto the surface portion of the specimen 1 between the opposed electrodes 2 and 2' (see FIGS. 5b and 5c). The nozzle and the blocking plate are thereafter returned to the positions shown in FIG. 5a.

Thus the movement of the blocking plate 7 produces the same effect as achieved by the horizontal movement of the specimen 1 relative to the nozzle 3.

FIG. 6 shows the construction of the nozzle 3 for performing the basic dripping operation. The nozzle 3 is provided with the aforementioned dispenser for forming the test solution 5 into drops of specified volume and forwarding the drops successively to the tip of the nozzle 3 to clean the interior of the tip of the nozzle 3, a vertical motion control assembly 9 for vertically shifting the nozzle 3 relative to the specimen 1, and a horizontal motion control assembly 10 for horizontally shifting the specimen 1 relative to the nozzle 3. The nozzle 3 has an orifice portion 3' of specified shape at its one end and is connected at the other end thereof to one end of a flexible conduit 11 having the dispenser at an intermediate portion. The other end of the conduit 11 extends into a tank 12 containing the test solution 5.

Figure 7A:
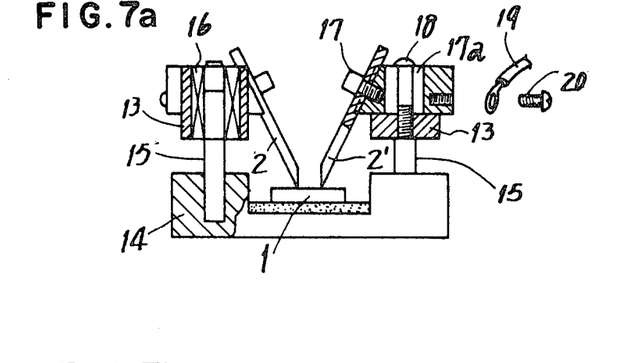
FIGS. 7a, 7b and 7c show a support assembly included in the apparatus for supporting opposed electrodes, FIG. 7a being a front view, FIG. 7b being a top view partly in section, and FIG. 7c being a view in vertical section showing an electrode head.
Figure 7B:
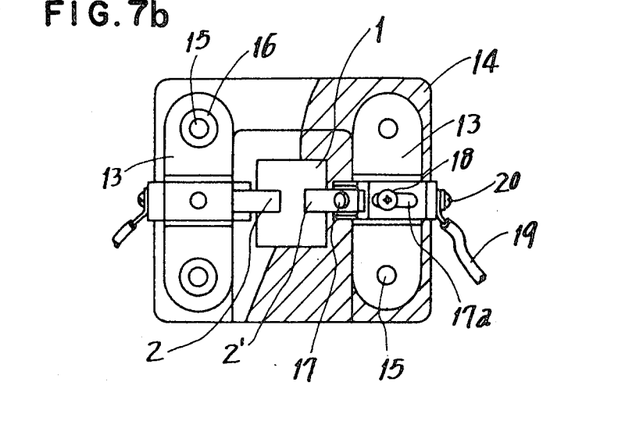
Figure 7C:
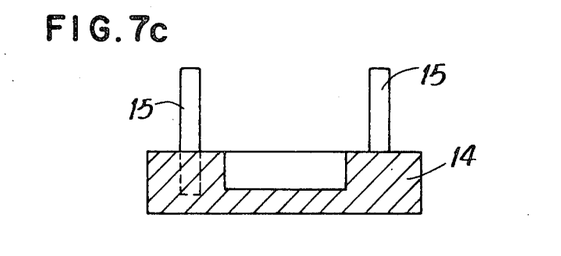

FIGS. 7a to 7c show a support assembly for the opposed electrodes 2 and 2', including supports 13 for the electrodes. The electrode support 13 is provided with slide bearings 16 for reducing the friction between the support 13 and slide rods 15 attached to an electrode heat 14, an electrode holder 17 for holding the electrode at a specified angle of contact with respect to the specimen, a screw 18 for adjusting the spacing between the opposed electrodes 2, 2' by shiftably retaining the holder 17 in cooperation with a slot 17a, and a connector 20 for connecting a power supply lead 19 to one end of the holder 17.

Figure 8:
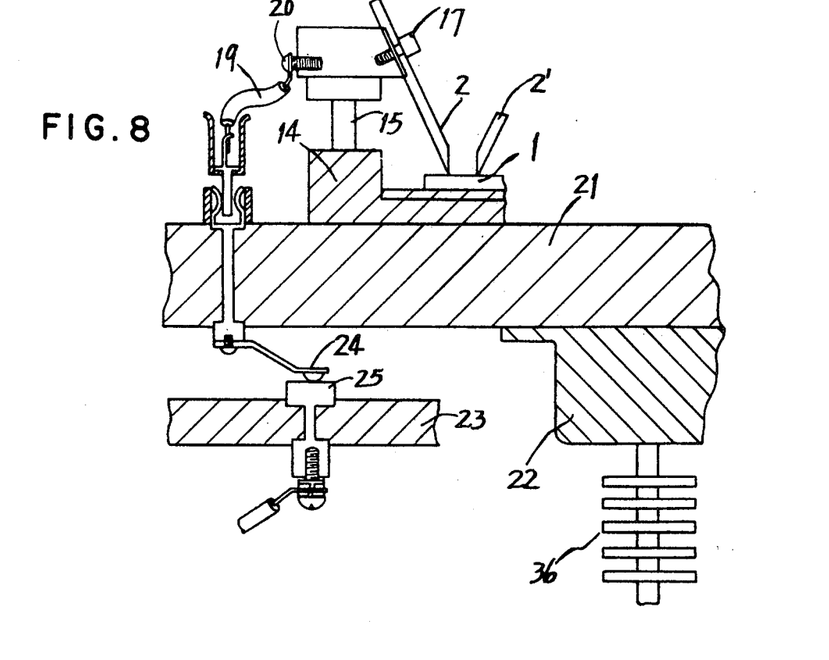
FIG. 8 is a view in vertical section showing a movable terminal included in the apparatus.

To move the specimen 1 horizontally relative to the nozzle 3 for the basic dripping operation when the nozzle 3 is in its fixed position, there arises a need to use a movable terminal since the specimen must be so moved with a supply of specified power thereto by way of the electrodes 2, 2'. FIG. 8 shows the movable terminal comprising a movable terminal disk 21 which is provided with six electrode heads 14 each having the pair of electrodes 2 and 2'. The electrode heads 14 are arranged side by side on a circumference equidistantly at an angular spacing of 60 degrees about the center of the disk 21. The terminal disk 21 is rotated by drive means 22 on its own axis at a speed of one revolution per 30 seconds as specified by the standard. To continuously supply electric power to the opposed electrodes 2, 2' on the movable terminal disk 21, conductive brushes 24 connected to the electrodes are held in contact with conductive rails 25 on a stationary terminal plate 23 while the disk 21 is in rotation. The rails 25 are equal in number to the number of the electrodes 2, 2' (namely, twelve) or to the number of the pairs of electrodes (namely six) plus one (in common use for grounding) according to the embodiment of FIG. 8. With the rotation of the movable terminal disk 21, power is supplied to the pairs of electrodes continuously and separately. Alternatively the brushes 24 may be provided on the stationary terminal plate 23 with the rails attached to the movable terminal disk 21.

Figure 9A:
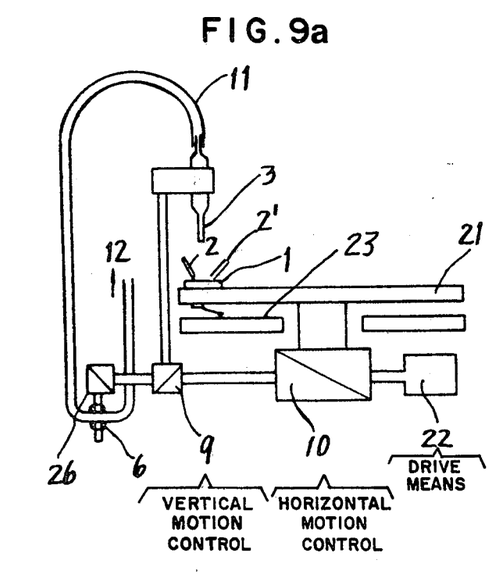
Figure 9B:
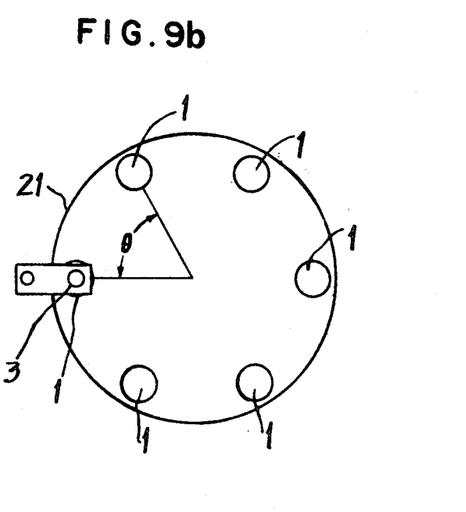

In order to reproduce the basic dripping operation accurately, the specimen and the dripping nozzle 3 must be moved horizontally and vertically relative to each other accurately with use of a coupling mechanism, which is shown in FIGS. 9a and 9b. A horizontal motion control assembly 10 for moving the six specimens 1 horizontally is attached to the movable terminal disk 21, while the nozzle 3 is provided with a vertical motion control assembly 9 for moving the nozzle vertically. The disk 21, which is disposed in the position shown in FIG. 9a, is intermittently driven through an angle θ (namely 60 degrees in FIG. 9b) at a time in corresponding relation to the number of the specimens while being rotated at an overall speed of one revolution per 30 seconds to drip the test solution with a frequency of one drop per 30 seconds. As shown in FIG. 9a, the control assembly 10 is provided with a coupling gear 26 through which the control assembly 9 and the dispenser 6 are driven. The nozzle 3 moves vertically during the temporary interruption of the movement of the disk 21 in intermittent rotation, namely, while the specimen 1 is positioned immediately below the nozzle 3. Thus the nozzle 3 moves vertically repeatedly during the interruptions. When the movable terminal disk 21 makes one revolution per 30 seconds, the dripping of the test solution onto any particular one of the equidistantly arranged specimens 1 is controlled to a rate of one drop per 30 seconds. While drops are applied to the other five specimens in succession, that particular specimen 1 is away from below the nozzle 3. If the dispenser 6 is adapted to form drops in timed relation to the vertical motion of the nozzle 3, the nozzle 3 will then drip the test solution 5 at a rate of one drop per 30/6 seconds, namely, every 5 seconds when the disk 21 carries six specimens 1. This effectively cleans the interior of the nozzle 3.

Figures 10A, 10B:
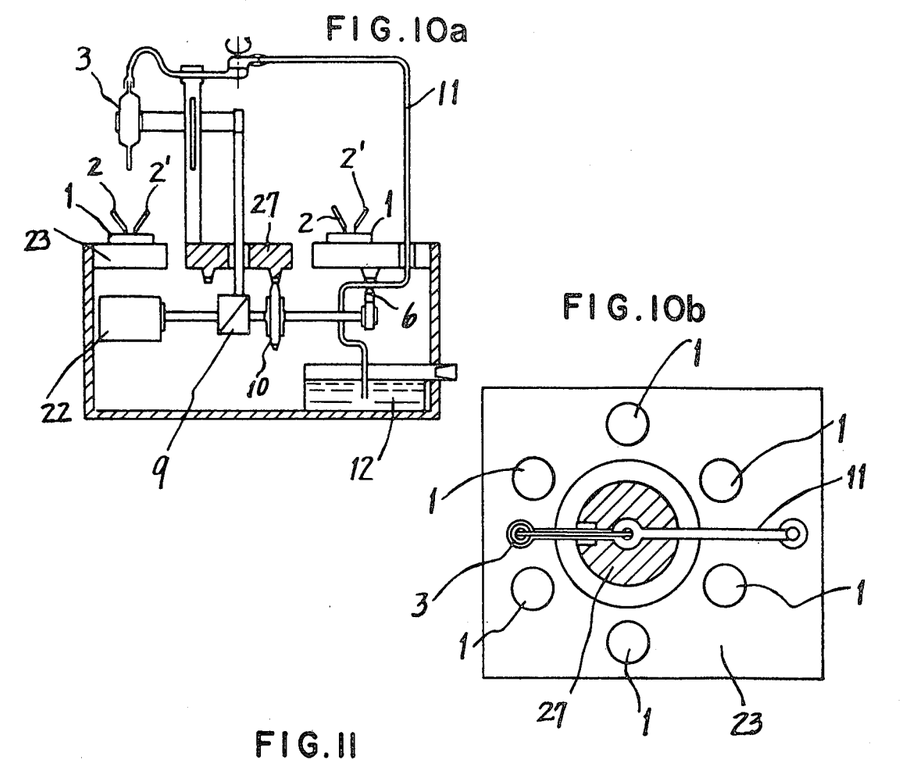
FIGS. 10a and 10b schematically show a turnable dripping nozzle, FIG. 10a being a front view partly in section and FIG. 10b being a top view partly in section.

FIGS. 10a and 10b show an arrangement comprising a stationary terminal plate 23 supporting several specimens 1 as equidistantly spaced apart along a circumference, and a dripping nozzle 3 intermittently rotatable by a horizontally driving member 27 and vertically movable during interruptions of the rotation. This arrangement performs the same basic dripping operation as the apparatus of FIGS. 9a and 9b.

Figure 11:
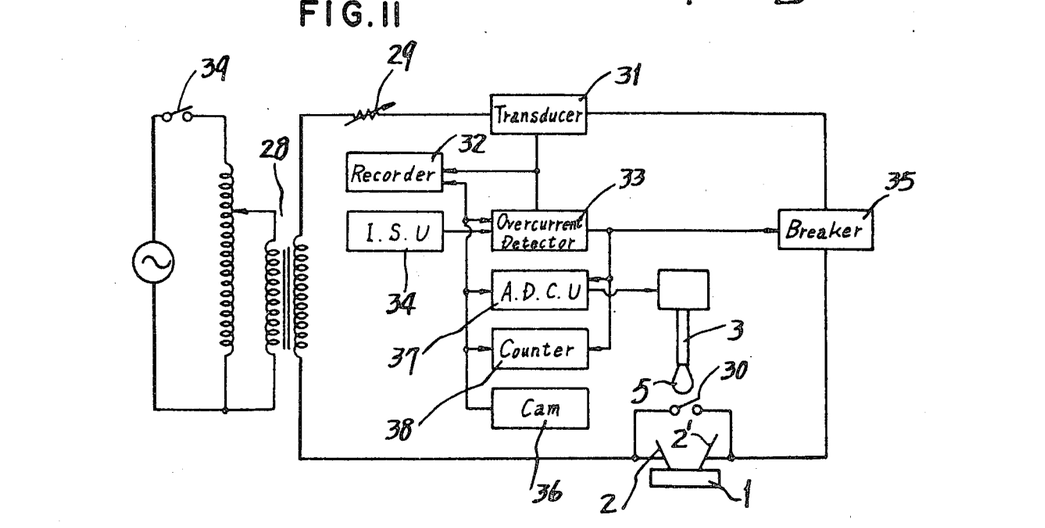
FIG. 11 is a diagram showing an electric control circuit for the apparatus.

FIG. 11 shows a power supply and a measuring and controlling circuit for a pair of opposed electrodes. The power supply comprises a voltage setting unit 28 for controlling the voltage to be applied across the electrodes 2 and 2' and a variable resistor 29 for controlling short-circuit current $I_S$ when the electrodes 2 and 2' are short-circuited. The power supply must have a high capacity such that the voltage $V_S$ when the electrodes 2, 2' are short-circuited by a switch 30 and the voltage $V_S'$ when this circuit is opened will be constant at least in the $I_S$ range of 0.1 to 1.0 A. The circuit of FIG. 11 includes a transducer 31 by which variations in the current $I_R$ flowing between the electrodes 2, 2' via the specimen 1 are converted to measuring and controlling signals, a measurement recorder 32, an overcurrent detector 33, an interruption setting unit 34 (indicated as I.S.U. in FIG. 11) for setting the current value $I_C$ at which the power supply should be interrupted and the duration of the interruption of the power supply, and a breaker 35 for comparing the current $I_R$ with the value set by the unit 34 to break the circuit. The circuit of FIG. 11 thus functions to measure the current $I_R$ and interrupt the power supply in the presence of overcurrent. There is further provided an automatic dripping control unit (indicated as A.D.C.U. in FIG. 11) 37 by which in response to the interruption of the circuit the signal from a cam 36 rotating with the movable terminal disk 21 is stopped to halt the operation of the nozzle 3 positioned for the pair of electrodes 2, 2', to prevent dripping upon interruption of the power supply and to automatically stop a drop counter 38. When a parallel test is to be conducted with pairs of opposed electrodes, it is necessary to use a power supply of correspondingly increased capacity and measuring and controlling units which are independent of one another, but one dripping control unit is usable for all the pairs of electrodes since it is operable with different timings.

From the operation of the cam 36 rotatable with the movable terminal disk 21, the interval between the drippings can be measured. This is useful for separately measuring various phenomena shown in the wave forms of leakage current (FIG. 14) to be described later. When the test solution is applied to the specimen, the solution acts to cool the specimen and eliminate discharge or ignition, while a leakage current in accordance with the resistance of the solution, the surface resistance of the specimen and the applied voltage flows until the solution has evaporated off. The current value during the evaporation of the test solution is at least 0.2 A. The duration of the evaporation is about 10 seconds, after which discharge or ignition occurs. The value of the current then flowing in the initial stage is up to 0.1 A and is exceedingly lower than the value of the current passing through the test solution. For the detection of the current in the initial stage, therefore, the leakage current through the solution must be excluded. This can be done by resorting to time division. The cam 36 is usable for providing this time division.

The testing procedure will now be described. First, the main power supply switch 39 is closed, and the voltage setting unit 28 is adjusted to set the test voltage. Next, the switch 30 is closed to short-circuit the electrodes 2, 2'. The variable resistor 29 is adjusted to set the short-circuit current. The switch 30 is then opened. The cut-off current $I_C$ and the duration of cut-off or interruption are set by the unit 34. The main power supply switch 39 is thereafter opened.

Subsequently the spacing between the electrodes 2, 2' is adjusted to the specified distance with the screws 18. A specimen 1 is placed under the electrodes.

With the apparatus thus set for testing, the main switch 39 is closed, whereupon the cam 36 operates to start testing the specimen 1. With the application of the test solution to the specimen 1 from the nozzle 3, current flows between the electrodes 2, 2' through the solution. The variation of the current is measured by the transducer 31 and also converted to a control signal, which is fed to the recorder 32 for recording. Further application of the solution impairs the insulating properties of the specimen, giving rise to scintillation across the electrodes 2, 2'. The scintillation current and variations in the current due to the resulting ignition of the specimen 1 are recorded similarly on the recorder 32. With further degradation of the specimen surface, the current flowing between the electrodes 2, 2' increases. When the current has exceeded the cut-off condition preset by the interruption setting unit 34, the overcurrent detector 33 functions to control the breaker 35, dripping control unit 37 and drop counter 38 and automatically stop the power supply to the electrodes, dripping and counting. This terminates the usual tracking test.

Subsequently slowly increasing voltage is applied to the specimen immediately after the tracking breakdown to record the resulting variation of the current on the recorder 32 to check whether or not the current increases with the increase of the voltage, namely, to check the track for ohmic property.

Various lamps, meters, dials on switch adjusting means and like indicators provide indications of application of voltage, interruption of the circuit and other states needed for the operation and safety.

The control of the dripping condition thus effected has the following advantages afforded by the dripping nozzle, movable terminal disk and coupling means for shifting the specimen 1 and the dripping nozzle relative to each other.

(1) The nozzle 3 can be prevented from contamination since the specimen 1 is adapted to move away from below the nozzle 3.

(2) Shorting failure or fluctuations of the shorting condition are avoidable by employing forced dripping of the test solution onto the center portion of the specimen between the electrodes 2, 2'.

(3) The interior of the nozzle 3 can be cleaned, while the test solution can be kept free from contaminants.

Figure 12:
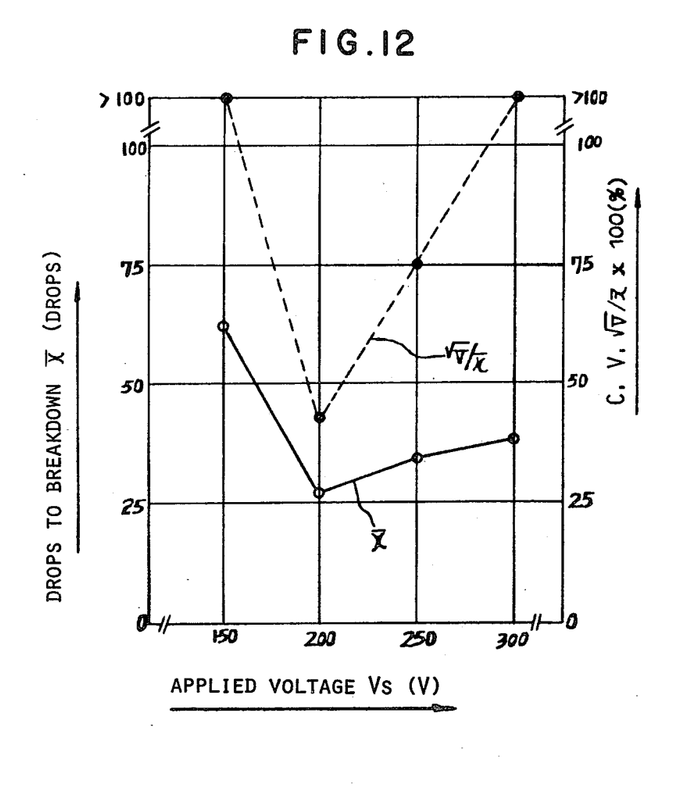
FIG. 12 is a diagram showing a CTI curve obtained under the IEC standard power supply conditions.

The apparatus of the invention was used to evaluate the same specimen as used for FIG. 3 under the same power condition, with the result shown in FIG. 12. Comparison between these two figures with respect to the coefficient of variation, CV, of data at applied voltage of 200 V reveals that the CV in FIG. 12 is as low as about ⅓ of that in FIG. 3. (CV is the ratio of standard deviation $\sqrt{V}$ to mean value $\bar{x}$, the number of repetitions n=5.) It is seen that the use of the present apparatus makes it possible to distinguish the voltage values involving a reduced CV value from those involving high CV values.

The fluctuation of the condition of contact between the specimen 1 and the electrodes 2, 2' is limited to cases where the specimen undergoes marked deformation, melts or evolves a large amount of gas when heated. On the other hand, the tracking phenomena on such insulator involves intense arc discharge resulting from excitation of the evolved gas and further leading to secondary heating or ignition or flash ignition of the insulator. Accordingly the fluctuation of the contact condition must be detected by observing the discharge occurring in the initial test stage in the vicinity of the point of contact between the specimen 1 and the electrode. The tests conducted with the arrangement of FIGS. 7a to 7c have shown that the discharge is more likely to occur in the center of the specimen between the electrodes than is the case with conventional apparatus. It is noted that the arrangement of FIG. 1 requires much labor for presetting the specimen 42 and the electrodes 41, 41' in the specified contact condition with a definite vertical load component of 100 g, a definite contact angle of 90 degrees and a definite spacing of 4 mm between the tips of the electrodes, so that the data obtained differ from operator to operator, whereas the apparatus of the invention does not require such labor for the setting of the condition and affords accurate data without personal differences.

Experiments have revealed that it takes about 2 seconds to form a 0.02-cc drop of the test solution by spontaneous dripping with use of a nozzle of 1 mm in outside diameter as specified. Further even if the dripping nozzle 3 should be temporarily heated to hundreds of degrees C. by arc discharge or burning flames of the specimen 1, the amount of solution applied and the intrinsic volume resistivity of the solution will not alter provided that the solution is dripped at a rate of one 0.02-cc drop per 5 seconds and that the number of the drops applied is up to 100. It follows from these data that the steady standard dripping condition is not available unless the nozzle releases drops of the solution at an interval of 2 to 5 seconds, whereas the standard prescribes that the test solution should be dripped at a rate of one drop every 30 seconds. Accordingly if the nozzle 3 is controlled to a dripping interval of 2 to 5 seconds for testing one specimen, 14 drops out of 15 drops will become excessive if the interval is 2 seconds, or 5 drops out of 6 drops will be excessive at an interval of 5 seconds. To assure an accurate dripping condition as above, there arises the necessity of horizontally moving the specimen 1 relative to the nozzle 3.

With the test apparatus of this invention, the movement for preventing the fluctuation of the dripping condition is utilized to test 6 to 15 specimens with one nozzle in parallel fashion. This assures improved test efficiency and accurate dripping condition without entailing waste of the test solution. The apparatus has another advantage that various phenomena can be compared at the same time as will be described later in detail. With use of an increased number of dripping nozzles, an increased number of specimens can be tested in parallel fashion.

The apparatus of the invention is adapted to test n specimens one after another in parallel mode with use of one dripping nozzle and therefore has the feature of producing no difference in the dripping condition between the n specimens, thus permitting comparative evaluation of various phenomena.

Given below are various test results achieved by the test apparatus of the invention having 12 electrodes arranged equidistantly and independently. Based on combinations of the number of conditions, p, and the number of repetitions, n, the apparatus is usable, for example, for:

(A) Determination of CTI curve:

$$p = 3 - 4/n = 4 - 3$$

(B) Separate evaluation of various phenomena:

$$p \leq 2/n \geq 6$$

(C) Determination of boundary condition $$p = 12/n = 1$$

Thus the apparatus operates to evaluate different phenomena, to measure the variations of current for each specimen and to check the tested specimen for ohmic property, all in parallel fashion.

Figure 13:
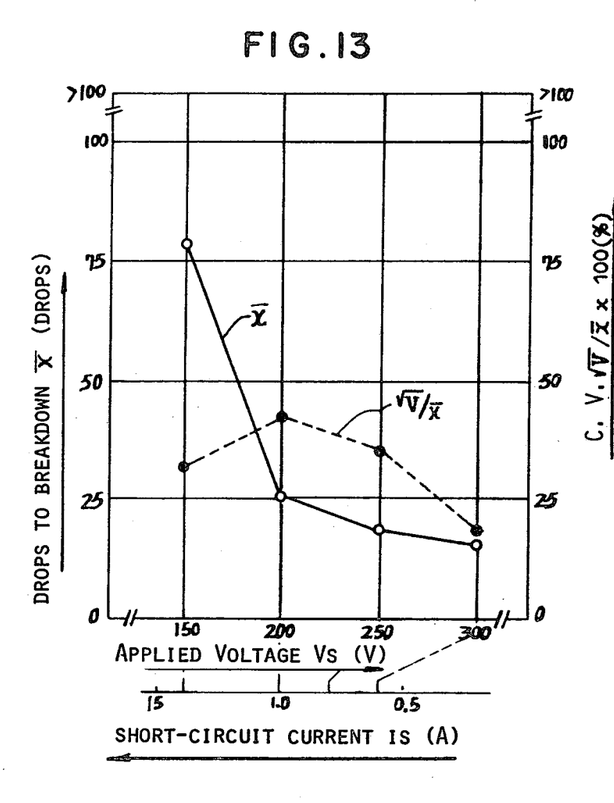
FIG. 13 is a diagram showing a CTI curve obtained under different power supply conditions.

FIG. 12 shows the relations of the applied voltage to the mean value $\bar{x}$ of tracking breakdown drops and to $\sqrt{V}/\bar{x}$ as determined with use of the same specimen as for FIG. 3 under the same conditions. The tracking breakdown drop counts were measured according to IEC Pub. 112 standard at four voltages levels with $n = 6$. Comparison between FIG. 3 and FIG. 12 reveals that the data of FIG. 12 involve reduced variations. The CTI curve of FIG. 12 nevertheless greatly differs from that of FIG. 2 according to IEC Pub. 112 standard. Accordingly the same specimen as above was tested again using high current at low voltage and low current at high voltage, thus varying the short-circuit current $I_S$ with the applied voltage $V_S$, although IEC Pub. 112 standard specifies a constant short-circuit current of 1 A. The curve obtained with the resulting data is shown in FIG. 13 which resembles the curve of FIG. 2. The data involve smaller variations than is the case with FIG. 12.

During the test conducted for FIG. 12, the current wave forms recorded included a wave form d in a low-voltage range where increased variations occurred and further included a wave form g in a high-voltage range where increased variations similarly occurred. (see FIG. 14). It was also noted that wetting of the electrode indicated by the wave form d and arc discharge represented by the wave form g both have high power dependence. With attention directed to these features, the test of FIG. 13 was conducted with different short-circuit current $I_S$.

Figure 14:
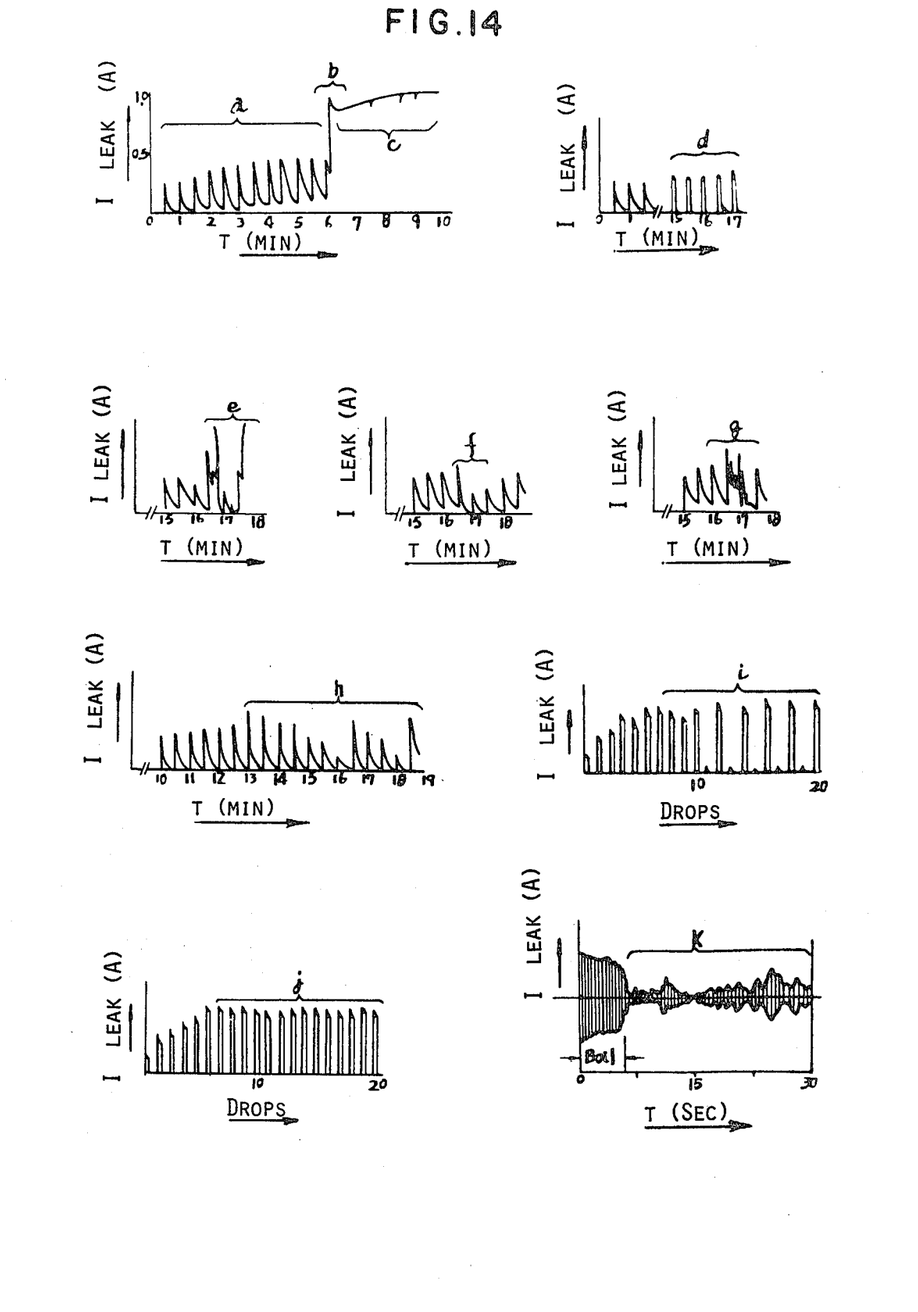
FIG. 14 show current wave forms representing the results of investigations of tracking phenomena on specimens of various kinds of materials.

FIG. 14 shows the results obtained by separately examining tracking phenomena on several tens of different materials with the lapse of time after the occurrence of the phenomena. The specimens were arranged at such an equal spacing that the dripping time interval $t_p$ would be equal to or larger than the evaporation time of the test solution measured under specified power supply and dripping test conditions, to differ the test time. A series power application method was used. A wave form a indicates a reduction in tracking resistance, wave form b a breakdown, wave form c self-heat generating glow, wave form d a reduction of the dry band between the electrodes and wetting and cooling of the electrode, wave form e ignition, wave form f a mechanical break of the track, wave form g arc discharge, and wave form h recovery of the resistance. The wave forms a to c show usual tracking phenomina which entail small variations of the data, but the wave forms d to h involve increased variations. A wave form i shows variations in leakage current on a glass specimen as determined by the spontaneous dripping method of FIG. 1. When specimens, like glass specimens, have a water-repellent surface, the test solution will wet the electrode during repeated drippings. When more than ten drops have been applied and if the power supply is small, the rate of deposition of the solution on the electrode exceeds the velocity of evaporation of the solution, so that the result resembles an insufficient amount of dripping, hence a shorting failure. A wave form j is indicative of variations in leakage current on a glass specimen resulting from the forcible dripping method of the invention (FIG. 4), as performed with the same power supply and same specimen as is the case with the wave form i. When the test solution is applied to the specimen with a vertically movable nozzle as if short-circuiting the opposed electrodes at their tips, the above-mentioned shorting failure is avoidable to afford a steady dripping condition irrespective of the water repellency of the specimen surface. In addition, the constant dripping condition can be maintained by the forced dripping method even when the specimen is emitting heat or smoke. A wave form k is obtained by recording on an oscillograph the leakage current per drop upon the occurrence of discharge or ignition, based on variations with lapse of time in the leakage current during repeated dripping so far described. While the test solution is dripped generally at a rate of one drop every 30 seconds, the solution will evaporate off within about 10 seconds, for example, when the applied voltage is 200 V and the specimen is made of glass. The wave form k was obtained on a specimen of organic material. The solution has evaporated in a shorter period of time of about 7 seconds owing to a reduction in the surface resistance of the specimen. During the evaporation of the test solution, the temperature of the solution drops to a level below 100° C., so that no discharge or ignition takes place. Discharge or ignition occurs during the period of about 20 seconds after the evaporation and before the subsequent dripping. However, since the leakage current during the evaporation of the solution is usually at least 0.2 A, whereas the discharge or ignition current is generally up to 0.2 A, it is difficult to detect discharge or ignition from the detected current value. Thus time division must be resorted to based on the evaporation time.

The variations of data involved in the wave forms d to h in FIG. 14 provide useful information for the detection of the foregoing various tracking phenomena. These variations of data are also useful for establishing the boundary condition on which the susceptability of the specimen to the tracking breakdown is dependent, even when the specimen is unlikely to afford the wave forms d to h in FIG. 14.

Figure 15A:
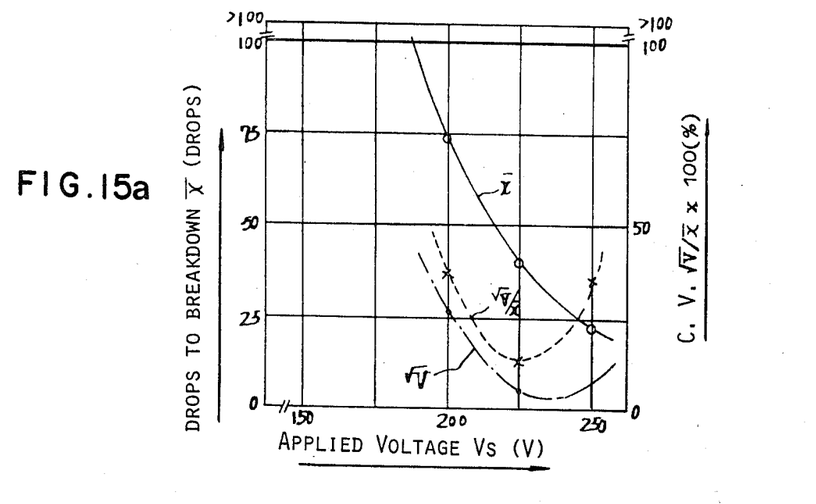
FIG. 15a is a diagram showing a CTI curve obtained with use of the apparatus at a constant short-circuit current.
Figure 15B:
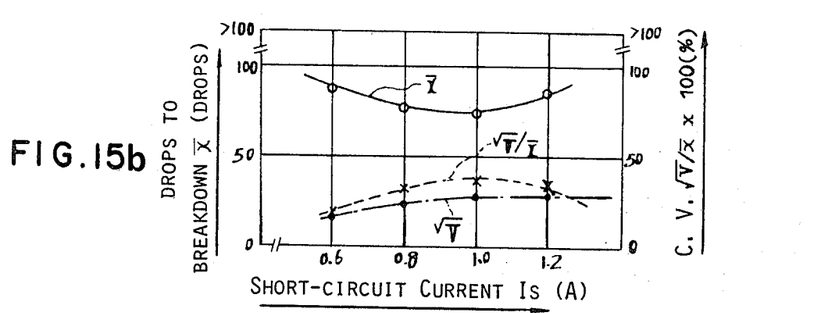
FIG. 15b is a diagram showing a CTI curve similarly obtained with application of a constant voltage.

FIG. 15 shows a CTI curve of a specimen which undergoes a tracking breakdown with surface current of wave forms a to c without involving wave form e or g (see FIG. 14). FIG. 15a shows a case in which the short-circuit current $I_S$ is constantly 1.0 A as specified by the standard. FIG. 15b shows another case in which the applied voltage $V_S$ is constantly 200 V. With reference to FIG. 15a, the relation between the voltage $V_S$ and the mean value $\bar{x}$ of the numbers of tracking breakdown drops has the same tendency as the specified relation of FIG. 2, but the curve of coefficient of variation $\sqrt{V}/\bar{x}$ is V-shaped, and $\sqrt{V}$ rises sharply at $V_S = 200$ V. Under this condition, FIG. 15b shows that $\sqrt{V}/\bar{x}$ is maximum at $I_S = 1.0$ A. FIGS. 15a and 15b indicate that the boundary condition governing the susceptibility of the specimen to the tracking breakdown is the applied voltage $V_S$ of 200 V and the short-circuit current $I_S$ of 1.0 A. The CTI curve is approximately in agreement with CTI=217 required by IEC Pub. 112 standard.

These results show that the test apparatus of the invention has the following outstanding features.

(1) Since the dripping condition is not different from specimen and specimen with reduced fluctuations of conditions during testing, variations of the data provide useful information for accurately determining the boundary condition governing the susceptibility of the specimen to a tracking breakdown if the tests for determining a CTI curve and the tests for giving the standard deviation are conducted in parallel manner.

(2) When variations in the wave form of the surface current flowing between each pair of electrodes during testing are accurately measured and recorded with lapse of time, the causes for the variations of data and various phenomena peculiar to a particular specimen can be evaluated.

Figure 16:
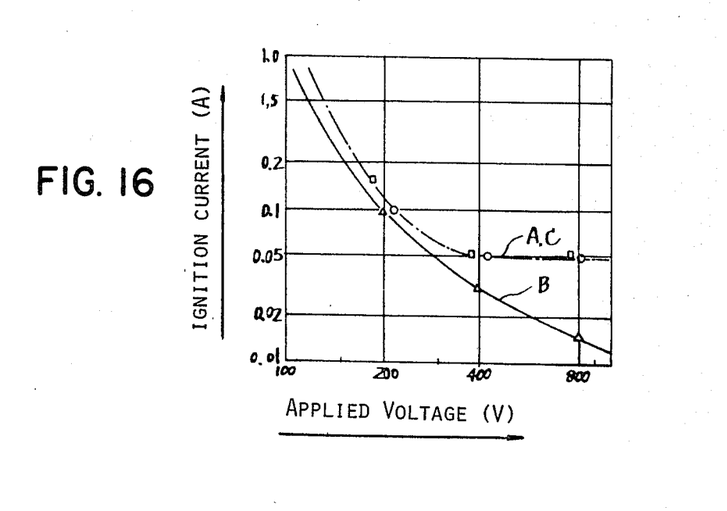
FIG. 16 is a diagram showing threshold ignition voltage-current characteristics of specimens before a breakdown.

FIG. 16 shows the threshold ignition voltage-current characteristics of phenol specimens A, B and C determined by testing the specimens for ignition before a breakdown, with the wave form c, e or g taken as the end point of the test. The test was conducted by gradually increasing the voltage and current to check whether or not ignition occurred with application of up to several drops, using a conventional apparatus equipped with a current wave form measuring device. Although the occurrence of ignition can be confirmed by observation during testing, the conditions must be set stepwise for accurate determination of the boundary condition. This requires considerable time and labor. Additionally marked evolution of gas and smoke and rise of temperature under the ignition condition will lead to fluctuations of the electrode contact condition for dripping, while the test is not repeatable with good reproducibility. Consequently the nozzle and electrodes must be polished or washed for maintenance before the repetition of the test. These problems can be overcome with the test apparatus of the invention having the following features.

(1) All the six pairs of electrodes are settable for the proper dripping condition without any likelihood of pair-to-pair difference, while the test can be conducted with minimized fluctuations of the condition. This permits simultaneous comparison under 12-step conditions with n of 1.

(2) The current flowing between each pair of electrodes is recorded automatically independently during testing, so that no special measuring procedure is needed. This assures accurate evaluation.

Although six pairs of electrodes are used in the above embodiment, the number of the electrodes is not particularly limited but any desired number of electrodes are of course usable in accordance with the contemplated purpose. For example, if 12 pairs of electrodes are mounted on a turnable disk (movable terminal disk) as arranged on a circumference at an angular spacing of 30 degrees about the axis of the disc, the position of each pair at a certain time can be indicated in analog fashion in corresponding relation to the time indication of a clock. For example, an interruption of power supply to a pair of electrodes can be indicated in terms of a position on the face of the clock corresponding to a certain time. The data can then be handled with greater ease.

What is claimed is:

1. A testing apparatus for dielectric breakdown caused by tracking phenomena comprising:
    a dripping nozzle;
    a plurality of pairs of opposed electrodes each being adapted to be held in contact with one of a corresponding number of specimens to be tested;
    moving means for successively moving the pairs of electrodes together with the specimens relative to the nozzle repetitively at an overall time interval but intermittently at a constant smaller time interval in a manner such that each specimen is stopped for a specified period when it is in a position immediately below the nozzle;
    dripping control means for dripping a test solution from the nozzle to each specimen at a location between each pair of electrodes when the specimen is immediately below the nozzle;
    power supply means for supplying electric power to the plurality of pairs of electrodes;
    power control means for controlling power supply condition for the electrodes and on-off condition therefor; and
    means for detecting current through each pair of electrodes.

2. A testing apparatus as defined in claim 1 further comprising cam means coupled to the moving means and associated with each pair of electrodes for dividing said overall time interval into a plurality of time sections, interrupting means for cutting off the power supply by comparing the current detected by the detecting means during each time section, and a time meter for measuring the number of the overall time intervals and time sections elapsed.

3. A testing apparatus as defined in claim 1 wherein the dripping control means is brought out of operation in response to a detecting signal from the detecting means.

4. A testing apparatus as defined in claim 1 further comprising means for altering the distance between the pair of electrodes and the nozzle when the pair is brought to the position immediately below the nozzle.

5. A testing apparatus as defined in claim 1 wherein each of the electrodes is mounted on a sliding member slidably supported on a vertical rod.

6. A testing apparatus as defined in claim 1 wherein a movable blocking plate is positionable between the nozzle and the pair of electrodes in the position immediately below the nozzle.

7. A testing apparatus as defined in claim 1 further comprising means for lowering and raising the dripping nozzle relative to the specimens for the application of a drop of test solution from the lowered nozzle to each specimen when in said stopped position.

* * * * *